(12) United States Patent
Giunchi (10) Patent No.: US 8,615,867 B2
(45) Date of Patent: Dec. 31, 2013

(54) SUPERCONDUCTIVE ELEMENT AND RELATIVE PREPARATION PROCESS

(75) Inventor: Giovanni Giunchi, Milan (IT)

(73) Assignee: Edison S.p.A., Milan (IT)

( * ) Notice: Subject to any disclaimer, the term of this patent is extended or adjusted under 35 U.S.C. 154(b) by 564 days.

(21) Appl. No.: 12/802,762

(22) Filed: Jun. 14, 2010

(65) Prior Publication Data
US 2010/0323899 A1    Dec. 23, 2010

(30) Foreign Application Priority Data

Jun. 18, 2009  (IT) .............................. MI2009A1078

(51) Int. Cl.
| | |
|---|---|
| *H01L 39/14* | (2006.01) |
| *H01L 39/16* | (2006.01) |
| *H01L 39/24* | (2006.01) |
| *C04B 35/45* | (2006.01) |
| *C04B 35/58* | (2006.01) |
| *C22C 38/00* | (2006.01) |

(52) U.S. Cl.
USPC ............................. 29/599; 148/96; 505/917

(58) Field of Classification Search
USPC ............ 505/450–452, 500, 733, 917; 29/599; 148/98
See application file for complete search history.

(56) References Cited

U.S. PATENT DOCUMENTS

| | | | |
|---|---|---|---|
| 3,470,508 A | | 9/1969 | Donadieu |
| 4,943,792 A | | 7/1990 | Srivastava |
| 5,164,361 A | * | 11/1992 | Aprigliano et al. ........... 505/433 |
| 5,231,076 A | | 7/1993 | Jeong |
| 5,426,408 A | | 6/1995 | Jones |
| 2002/0198109 A1 | | 12/2002 | Wu |
| 2006/0268471 A1 | | 11/2006 | Lee |
| 2009/0258787 A1 | * | 10/2009 | Wilkie et al. .................. 505/231 |

FOREIGN PATENT DOCUMENTS

| | | | |
|---|---|---|---|
| DE | 10 2007 012008 A1 | | 9/2008 |
| EP | 0 349 365 A1 | | 1/1990 |
| EP | 0 503 447 A | | 9/1992 |
| EP | 0 513 867 A2 | | 11/1992 |
| EP | 1 429 399 A2 | | 6/2004 |
| JP | 64-64304 A | * | 3/1989 |
| JP | 2-162618 A | * | 6/1990 |
| WO | WO02/093659 A | | 11/2002 |
| WO | WO2009/010715 A | | 1/2009 |

OTHER PUBLICATIONS

EP Search Report dated Jan. 20, 2010.
Zhi-An Ren et al: Superconductivity and Phase Diagram in Iron-Based Arensic-Oxides ReFeAs01-(delta) Re=rare earthmetal) without fluorine doiping, Europhysics Letters, vol. 83, No. 1, Jul. 2008 p. 17002.

(Continued)

*Primary Examiner* — Mark Kopec
(74) *Attorney, Agent, or Firm* — Hedman & Costigan, P.C.; James V. Costigan; Kathleen A. Costigan (57) ABSTRACT

A superconductive element is described, comprising a rigid support made of a non-superconductive material, said support comprising at least one superconductive track formed by a groove containing a superconductive material having a density equal to at least 85% of the value of its theoretical density, and the process for producing said element. The present invention also relates to the possible uses of the superconductive elements, and also to superconductive devices comprising said superconductive elements.

8 Claims, 5 Drawing Sheets

(56) References Cited

OTHER PUBLICATIONS

B.C. Sales et al: "Bulk Superconductivity at 14K in Single Crystals of $Fe_{1+y}Te_xSe_{1-x}$", Physical Review B vol. 79, Mar. 24, 2009, pp. 094521-094521-5.

M. Bonvalot et al., "Ambient Pressure Synthesis of Tetragonal $Sr_2CuO_{3+x}$", Physica C, vol. 282-287, No. 2002 pp. 539-540(1997).

Ren-Zhi et al, "Superconductivity at 55K in Iron-Based F-Doped Layered Quaternary Compound $Sm[O_{1-x}F_x]FeAs$" Chinese Physics Letters, vol. 25, No. 6, Jun. 1, 2008, pp. 2215-2216.

EP Search Report dated Sep. 23, 2010.

Willis, J.O. et al., Magnetic Shielding by Superconducting Y-Ba-Cu-O Hollow Cylinders, IEEE Transactions on Magnetics USA, vol. 25, No. 2, Mar. 1989, pp. 2502-2505.

\* cited by examiner

SUPERCONDUCTIVE ELEMENT AND RELATIVE PREPARATION PROCESS

The present invention relates to a superconductive element and the relative preparation process.

The present invention is included in the technical field of superconductive materials.

In the different industrial application in which superconductive materials are used, it must be guaranteed that these materials have suitable characteristics of thermal and mechanical stability, in addition to specific electrotechnical functionalities.

In the state of the art, superconductive materials are normally prepared in the form of wires, thick or thin strips or in the form of massive bodies. The wires and strips, normally having a thickness of less than 1 millimeter, are assembled together with supports made of non-superconductive material of the metallic or electrical insulating type. The function of the supports is to give the superconductive material suitable characteristics of mechanical strength in addition to suitable electrical and thermal characteristics, when necessary. The assembly of the superconductive wire or strip with a support, however, substantially reduces the section of wire or strip available for the passage of superconductive currents. In extreme cases, the ratio between the above section and the overall section of the supported wire or strip can drop to values lower than 20-30% of the original value of the superconductive wire or strip, drastically reducing the density of the superconductive current conveyed.

Fault current limiters consisting of superconductive inserts enclosed in non-superconductive supports are also described in literature. These fault current limiters, however, have an application field limited to low currents. They are in fact based on superconductive inserts produced with superconductive materials, such as superconductive oxides in polycrystalline form, which, due to the barriers between the crystalline grains, do not have a critical current density which is such as to allow them to be also used for other electrotechnical applications, such as those having high magnetic fields. In particular, their critical current density is not capable of producing economical magnetic field flux density comparable or better than those which can be produced with normal electromagnets or with classical permanent magnets, typically limited to values below 1 tesla.

Unlike wires or strips, superconductive currents can pass through the whole section of superconductive materials in the form of massive bodies. They are generally prepared in the form of plates, cylinders, rings or pipes having a thickness of various millimeters. When the superconductive material is malleable, such as, for example, Pb and Nb (superconductive materials at temperatures lower than 9 K), they can also be prepared in the form of thin sheets or laminas.

For applications at temperatures higher than 10 K, superconductive massive bodies can consist of:
  ceramic oxides, such as for example cuprates based on yttrium and barium (superconductive up to the critical temperature, Tc, of about 90 K) or based on strontium, such as for example $Sr_2CuO_{3.4}$ (Tc=95K) or based on bismuth, strontium and calcium (Tc=110 K),
  iron-based materials, such as for example, $FeTe_{0.5}Se_{0.5}$ (Tc=13 K) or $Ba_{0.6}K_{0.4}Fe_2As_2$ (Tc=38 K) or $FeAsNdO_{0.85}$ (Tc=51 K),
  magnesium diboride (Tc=39 K),
  intermetallic compounds, such as for example $Nb_3Sn$ (Tc=18.7 K), $Nb_3Al$ (Tc=21.3 K) or $Nb_3Ge$ (Tc=23.6 K).

The best performances, in terms of critical current density, are generally obtained with massive materials in a highly densified form, in particular when they are in a state of high crystalline perfection (mono-crystalline state).

The preparation of superconductive massive materials in a highly densified form and in mono-crystalline state, however, is not easy to do. The growth and orientation process of the crystalline grains, in fact, is a rather lengthy and complex process, which requires in particular a careful temperature control during the crystallization process and which leads to superconductive end-products having a maximum dimension limited to a few centimeters.

Among the above superconductive materials produced in massive form and having a critical temperature higher than 10 K, magnesium diboride ($MgB_2$) can be distinguished for being able to be usefully adopted also in polycrystalline form. This is possible as the passage of the superconductive currents in this material is not greatly influenced by the passage of the boundaries between the crystalline grains and orientation of the grains themselves.

A further distinctive characteristic of magnesium diboride is that it can be prepared in a highly densified form.

Analogously to other superconductive materials having a critical temperature higher than 10 K, magnesium diboride, however, is a fragile material and therefore also requires adequate mechanical reinforcement to allow it to be effectively used in most of its applications. An adequate mechanical strength, in particular, is indispensable in applications characterized by the presence of particularly intense electromagnetic forces, such as, for example, in magnets for high magnetic fields where the electric currents in question are in the order of thousands of amperes and the magnetic field flux densities are generally higher than 1 tesla.

In most applications, however, the use of massive superconductive end-products having a considerable thickness (in the order of a centimeter or higher), regardless of the superconductive material, is not convenient. This is due, on the one side, to the fact that the superconductive currents tend to be distributed on only a part of the superconductive end-product (prevalently on the surface) and, on the other, to the fact that great thicknesses prevent a rapid cooling of the superconductive material when, during its functioning, there are transitions from the superconductivity state to that of normal conduction, accompanied by the instantaneous release of high quantities of heat energy.

A further technical problem of superconductive devices with inserts on rigid supports known in the state of the art lies in the fact that with the known techniques, it is not always possible to produce these devices in the desired form and dimensions.

In order to obtain sintered bodies of particularly dense ceramic materials and when the type of material, for thermodynamic reasons, prevents its spontaneous sintering at atmospheric pressure, hot pressing densification techniques can be used. These techniques comprise applying a pressure to the pre-compacted ceramic powders, at typical sintering temperatures (approximately about ¾ of the absolute melting temperature of the material) to favour the sintering process. The temperatures generally range from 700° C. to 1600° C. and the pressures can reach various hundreds of atmospheres. Depending on the procedure with which the pressure is applied, there can be: a) uniaxial compression, b) isostatic compression. For uniaxial compression, presses having the powder container and compression piston generally made of graphite are used, which can be heated for example by induction or with specific resistors made of silicon carbide. The main disadvantage of this technique is due to the mechanical resistance of the container, which considerably limits the dimensions of the pieces to be pressed.

Uniaxial compression is therefore suitable for producing end-products which have extremely different dimensions in the two spatial directions (for example, plates or laminas), so that there are no large deformations in a direction perpendicular to that of the pressure application.

Isostatic compression uses a hot gas as fluid for transferring the pressure applied to the powders to be sintered. Isostatic compression is effected in a machine comprising a large pressure-sealed chamber in which the piece to be densified is inserted, covered either with a metal sheath or a layer of vitreous material which becomes plastic at high treatment temperatures, so as to assist the pressure transfer from the gas to the piece. Even with this technique, the dimensions of the superconductive end-products that can be produced are limited to a few tens of cm.

Considering the limits of the techniques described above, it is evident that these techniques are of little use in the preparation of devices with superconductive inserts inlayed on rigid supports, for example made of metal or ceramic material, which offer a high mechanical resistance. In particular, with the uniaxial technique it is not possible to produce device having supports with a non-planar geometry.

In the case of materials which require a hot pressing, the form of the inlays prevents an adequate and simple application of the pressure to the powders, as the structure of the substrate hinders, as in the case of uniaxial pressure on a non-planar substrate, a direct transfer of the deformation to the powder. Also in the isostatic case, the substrate is a great hindrance to the pressure transfer on the powders, as only deformations of the material which covers the powder on the exposed surface of the inlay and in the direction perpendicular to this, are effective.

In the state of the art, in order to prepare superconductive devices comprising superconductive inserts on rigid supports, resort is also made to the melt densification technique. U.S. Pat. No. 5,426,408, for example, describes flat supports having one side made of a conductive material and the opposite side made of an insulating material. The inserts are made of superconductive material based on bismuth or yttrium copper oxides. The inserts are prepared by distribution of the superconductive material on the surface of the support (screen printing) and subsequent thermal treatment at the melting point of the superconductive material (melt densification). U.S. Pat. No. 5,426,408 also describes superconductive magnetic modules consisting of a plurality of the above devices, connected to each other by means of holes in the support filled with superconductive material. These superconductive connections put the insert of a first device in electric contact with that of a second device. The superconductive inserts of the devices and magnetic modules described in U.S. Pat. No. 5,426,408, however, have a very limited thickness, varying within the range of 50-200 μm. Furthermore, in the case of superconductors based on yttrium copper oxides, the density of the superconductive material obtainable in the inserts and in the superconductive connections with the technique described above, is at the most equal to about 70% of its theoretical density. This is known to experts in the field, for example, from the publication of J. O. Willis et al. in IEEE TRANSACTIONS ON MAGNETICS, Vol. 25, No. 2, March 1989, 2502-2504.

The document EP 0503447 describes superconductive devices consisting of superconductive inserts on non-superconductive rigid supports. Also in this case, the conductive inserts are obtained by means of the so-called "melt densification" technique. As already mentioned, however, this technique does not allow inserts of superconductive material with a high density to be obtained. The devices described in EP 0503447 consequently also have a limited capacity of transporting high current densities.

An objective of the present invention is to overcome the drawbacks revealed in the state of the art.

A first object of the present invention relates to a superconductive element comprising a rigid support made of a non-superconductive material, said support comprising at least one superconductive track formed by a groove containing a superconductive material having a real density equal to at least 85% of the value of its theoretical density, preferably equal to at least 88%.

A second object of the present invention relates to a process for preparing a superconductive element comprising the following operative steps:

a) making at least one groove on the surface of a rigid support made of non-superconductive material;
b) inserting a powdered precursor of a superconductive material inside the groove and compacting it up to a real density value equal to at least 50% of the theoretical density value;
c) positioning at least one solid reactant in contact with the precursor powder or else in a position adjacent to the groove in which the powder is contained;
d) subjecting the reactant and the groove containing the precursor to heating until the reactant is liquefied and subsequently infiltrates inside the precursor powder with formation of a superconductive track inside the groove.

For a better understanding of the characteristics of the present invention, in the description reference will be made to the following figures.

The superconductive element, object of the present invention, comprises a rigid support made of a non-superconductive material on whose surface at least one conductive track is etched of a superconductive material having a section of a few $mm^2$.

Figure 1:
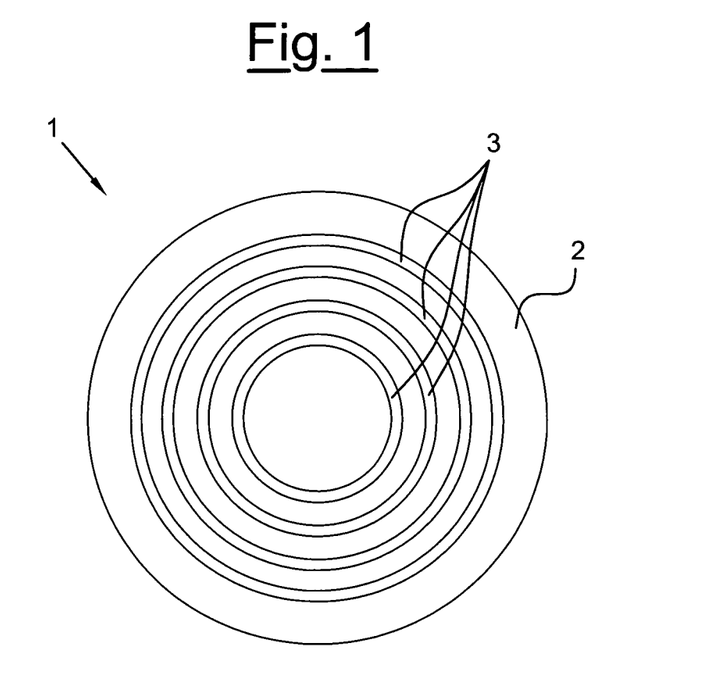
FIG. 1, schematic representation of a view from above of a superconductive element according to the present invention.

With reference to the embodiment illustrated in FIG. 1, a superconductive element 1 object of the present invention consists of a support 2, in this case a circular disk, containing on its surface circular superconductive tracks 3, arranged in the form of concentric rings.

The superconductive track 3 of the superconductive element 1 can be produced with any superconductive material, provided it has a density higher than or equal to 85% of the value of its theoretical density. The density is preferably higher than 88%. Preferred superconductive materials are the following: $MgB_2$, $FeNdAsO_{0.85}$, $FeTe_{0.5}Se_{0.5}$, $Sr_2CuO_{3.4}$.

A particularly preferred embodiment of the present invention is a superconductive element in which the conductive tracks comprise $MgB_2$ as superconductive material, as tracks consisting of $MgB_2$ can be prepared in a highly densified form in a much simpler way than other known superconductive materials in the state of the art and they do not have problems relating to a limited current density due to the presence of grain boundaries in the usual polycrystalline form.

For the purposes of the present invention, the term "highly densified" refers to a material having a density higher than or equal to 85% of the value of its theoretical density.

A conductive track consisting of a thin inlay of a superconductor in a highly densified form gives the superconductive element higher electric current transmission properties with respect to the same superconductive elements having tracks produced with other types of less densified superconductive materials. In addition, the reduced thickness of the useful track, deriving from its higher density, favours a more rapid cooling of the superconductive material and a less destructive dispersion of the superconductive streams during transition to the normal conduction state.

A further advantage of a superconductive element with inlays is that it can also be produced with tracks having a helicoidal development inlayed around the surfaces of the support. The helicoidal inlays allow the formation of windings which simulate the braiding of wires. This morphology of the superconductive windings is particularly useful in magnets with a high magnetic field to reduce phenomena of instability, when there are current transients as occurs in charging or with uses in alternating current.

Another advantage of a superconductive element with inlays is that it can be produced in the form of a strip consisting of the intersecting of groups of parallel superconductive tracks, overlapping each other. The strips with superconductive tracks can be produced with forming processes of the grooves of the support, such as shear cutting or laser cutting, for example. The whole preparation process of the superconductive element can be effected in continuous, and comprises operations for charging the precursor materials inside the grooves, positioning the reactants and thermal treatment, in succession. In this way, it is possible to produce strips in any desired length.

The support of the superconductive element, object of the present invention, is a rigid support made of a non-superconductive material, having any geometrical form.

The form of the support is selected in relation to the use for which the superconductive element is destined. The support is preferably in the form of a plate, disk, ring, strip or hollow cylinder having a thickness ranging from 2 mm to 30 mm, preferably from 3 to 20 mm. Regardless of its form, it is possible to prepare grooves on the whole surface of the support, pass-through or not: in the case of planar supports, for example in the form of a plate or disk, grooves can be engraved on both of the main sides of the support, i.e. on the sides having a larger surface; in the case of hollow cylindrical supports, the tracks can be inlayed on both the internal and external surface of the cavity. In the following description of the present invention, the term "surface of the support" refers to the overall surface of the support available for the inlaying of the grooves.

The material of the support is a non-superconductive material, preferably a material with a low electric conductivity, high mechanical characteristics and melting temperature more than 400° C. degrees higher that the reaction temperature to obtain the superconductive element. Examples of materials suitable for the production of the support are non-magnetic stainless steel, iron/nickel alloys, nickel and nickel/copper alloys with a high nickel content, i.e. higher than 50%, titanium, composites of these materials with copper, and also intermetallic compounds having a melting point higher than 1100° C., such as for example a zinc-tellurium compound.

In most cases of superconductive elements destined for electromagnetic applications, the material of the support must be non-magnetic. In these cases, it is preferable to use supports made of AISI 316 steel or nickel-copper alloys of the Monel type.

The material which forms the support must be resistant to the treatment applied to obtain the transformation of the precursor powder, positioned inside the groove, in a strip of superconductive material, i.e. in the superconductive track. The conversion of the precursor to superconductive material takes place by means of a treatment comprising a high-temperature chemical reaction between the precursor and one or more additional reactants. The precursor in powder form is inserted in the groove and the other reactants, preferably in the form of massive bodies, are placed outside the groove in such a position that, once liquefied as a result of the heating, they can enter into contact with the precursor.

For the purposes of the present invention, the term "precursor" indicates a solid material in powder form which, if subjected to suitable physico-chemical treatment, modifies its crystalline nature, becomes densified and acquires superconductive properties useful for the passage of the current. The precursor can also be a first component of a superconductive material which, by chemical reaction with a second component, is transformed into a superconductive material.

Figure 2:
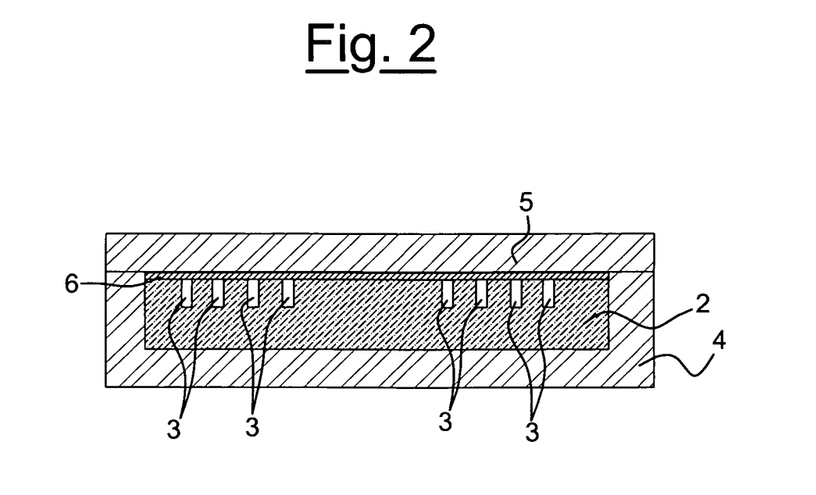
FIG. 2, schematic representation of a vertical section of a superconductive element according to the present invention enclosed in a reaction container having a sealable lid.

FIG. 2 schematically represents a vertical section of an end-product which can be used for obtaining a superconductive element according to the present invention. A reactant 6, necessary for the above conversion, in the form of a solid body superimposed with respect to the support 2 and the grooves containing the precursor (tracks 3) is inserted inside a container 4 (reaction container) having a lid 5, sealed for effecting the conversion treatment of the precursor to superconductive material.

Undesired reactions between the support and precursor or between the support and other reactants necessary for the conversion of the precursor to superconductive material can be avoided by suitably selecting the material of the support in relation to the reactants used, and also by applying a thin coating film of an inert refractory material (not shown in the figures) onto the support 2. The thickness of the film applied is preferably equal to about 0.5-20 microns.

The coating film is applied after tracing the grooves on the support, so as to coat both the surface of the support and the internal surface of the grooves.

The material of the coating film is selected in relation to the superconductive material with which the conductive tracks are to be produced. Coating films made of an electric insulating material of the oxide type, preferably films consisting of $MgO$, $SiO_2$, $Al_2O_3$, $NiO$, $Fe_2O_3$, $TiO_2$, $ZnO$, $ZrO_2$, $Y_2O_3$ or their compounds or coating films of the metallic type of Fe, Ni or Ti, are preferably used.

The films can be applied to the surface of the support and grooves with techniques known in the state of the art. The application of the coating film by means of oxidation techniques or the deposition of materials in vapour phase, such as for example the technique called Chemical Vapour Deposition (CVD), is particularly preferred.

The grooves on the surface of the support can be produced with the conventional processing techniques known in the state of the art, such as milling, turning, cutting or electric-erosion inlaying. The grooves can be produced in various forms and dimensions. The grooves traced on the support generally have a depth/width (D/W) ratio equal to or higher than 0.5, preferably higher than 1, even more preferably higher than 2. For thicknesses of the support ranging from 2 to 20 mm, the width of the groove is preferably less than or equal to 3 mm and its depth varies from 1.5 to 9 mm. It is useful at times to create grooves with a variable section, along their linear development, to better respond to the electromagnetic requirements of the superconductive element. It is possible however to reduce the depth of the superconductive track to D/W values lower than 0.5, in the finishing phase, in order to satisfy specific applicative demands.

The support of the superconductive element can have superconductive tracks of the open or closed type. A "closed" track is a superconductive track obtained starting from a groove which defines a closed line on the support, such as, for example, the grooves of the tracks 3 of FIG. 1 or the combination of grooves of the tracks 3 and 7 of FIG. 3.

Figure 3:
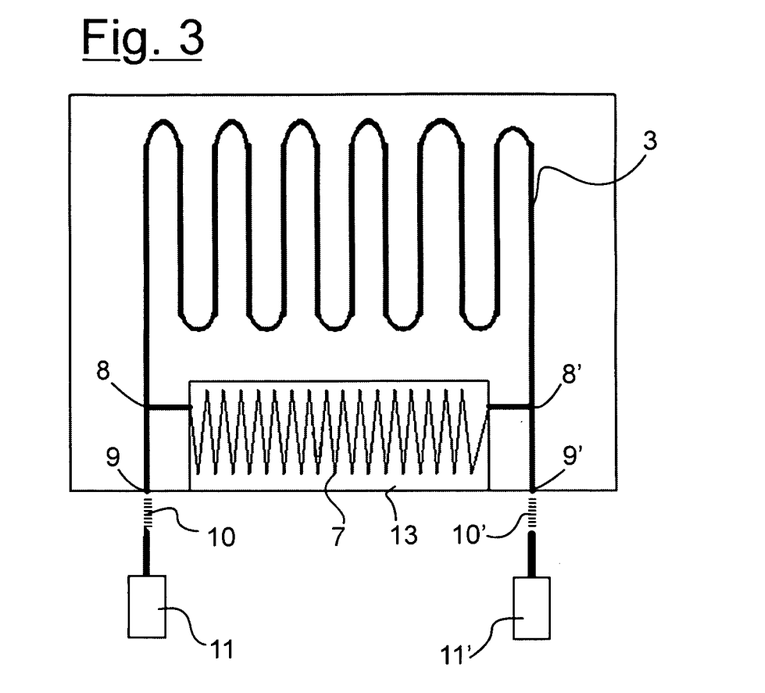
FIG. 3, schematic representation of a view from above of a further embodiment of a superconductive element according to the present invention.

An "open" track is a conductive track obtained starting from a groove which defines an open line on the support, i.e. a line having two ends terminating in distinct points of the support, such as for example, the lines connecting points 8 and 9 or the points 8' and 9' of the track 3 of FIG. 3. In a preferred embodiment, the open tracks are helical, i.e. with a helicoidal development.

When a superconductive element, object of the present invention, comprises closed tracks and an electric current passes through said tracks, the superconductive element acts as a permanent magnet having a magnetization which is fairly constant with times of interest for the applications.

When a superconductive element comprises open tracks and an electric current passes through said tracks, the superconductive element produces a variable magnetic field in relation to the current intensity which passes through the tracks.

The closed tracks can have any form. A closed track can also consist of open tracks situated in different areas of the surface of a same support (for example, two opposite sides of a flat support), said tracks being connected to each other by superconductive filaments or, in the case of two opposite sides of a support, holes in the support filled with superconductive material. The holes filled with superconductive material are hereafter also indicated as superconductive pass-throughs. The superconductive pass-throughs join any two points belonging to two distinct grooves.

A superconductive element according to the present invention can contemporaneously comprise one or more open and/or closed conductive tracks.

In a preferred embodiment, the superconductive element having closed tracks, object of the present invention, comprises one or more circular-shaped concentric tracks (FIG. 1). In a second preferred embodiment, the superconductive element has spiral-shaped open tracks inlayed on opposite sides of a flat support or along the opposite walls of a cylindrical support, said tracks being connected to each other by two superconductive pass-throughs.

A further object of the present invention relates to a superconductive device comprising a first and a second superconductive element, each having at least one open track, wherein a first open track of a first superconductive element is connected by means of one or more superconductive filaments to a second open track of a second superconductive element. The supports of the superconductive elements which form the superconductive device can possibly be electrically connected to each other.

Figures 4A, 4B:
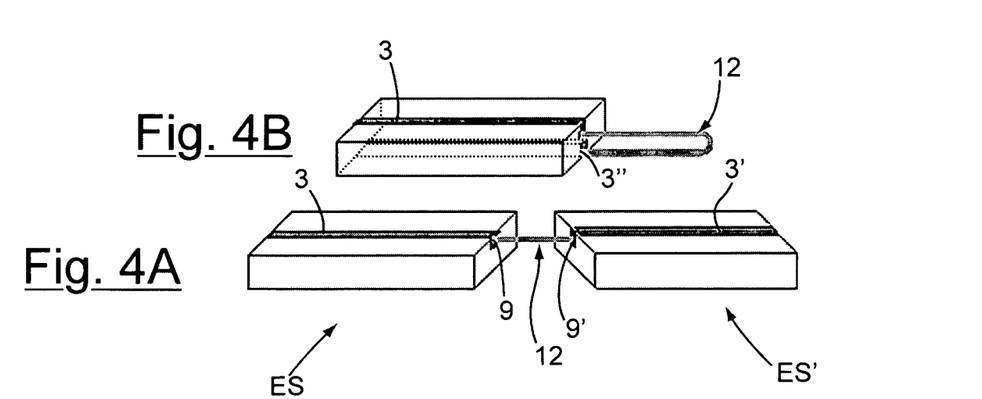
FIG. 4A, schematic representation of a possible connection mode between two superconductive tracks of the same superconductive element by means of a superconductive filament.
FIG. 4B, schematic representation of a superconductive device comprising two superconductive elements connected to each other by means of a superconductive filament which connects two superconductive tracks belonging to two different superconductive elements.

The open tracks of a superconductive element can be connected to each other by means of one or more superconductive filaments. These superconductive filaments are made integral with the superconductive material of the tracks, by entrapping the ends of the filaments between the precursor powder of the superconductive material inserted in the groove and effecting the precursor-superconductor conversion reaction in the presence of these filaments. In particular, the superconductive tracks to be connected can belong to the same superconductive element (FIG. 4B) or to distinct superconductive elements, i.e. forming a superconductive device (FIG. 4A). In this latter case, the superconductive elements can be connected to each other in series or parallelly.

To give greater mechanical strength to the superconductive devices of the present invention, the superconductive elements can be connected to each other, for example, by means of connection stands between the supports made of a non-superconductive material. In the same way, to mechanically reinforce the superconductive filaments connected to the superconductive elements, the superconductive filaments can be inserted in specific grooves situated on the same support as that of the superconductive element or on additional supports. The superconductive filaments can be kept in position inside the grooves by positioning the massive body of the reactant to be liquefied inside the reaction container in a such a point that it can infiltrate not only inside the grooves containing the precursor, but also into the grooves containing the superconductive filaments. At the end of the precursor-superconductor conversion reaction, the liquid reactant which has infiltrated into the grooves of the superconductive filaments solidifies fixing the latter firmly to the support.

A first connection example of two superconductive elements inside a superconductive device, object of the present invention, is shown in FIG. 4A. Two superconductive elements ES and ES' are connected by means of a superconductive filament 12 which connects an end 9 of an open track 3 of the superconductive element ES to an end 9' of an open track 3' situated on the second superconductive element ES'.

A second connection example of two superconductive elements is shown in FIG. 4B. FIG. 4B shows a connection obtained by means of a superconductive filament 12 which connects two open tracks 3 and 3" positioned on the same superconductive element ES. FIGS. 4A and 4B do not show the connection stands for mechanically reinforcing the superconductive filaments.

The connections described above only exemplify the various possible ways of connecting two or more superconductive elements, object of the present invention, and consequently cannot be considered as limiting the protection scope of the invention.

A further preferred embodiment of a superconductive element according to the present invention is illustrated in FIG. 3. In the superconductive element of FIG. 3, two points 8 and 8' of a same conductive track 3 are connected by means of a superconductive filament 13 which acts as a thermal superconductive switch, consisting of one or more superconductive filaments much thinner than the track 3 (with an overall superconductive section at least 20% smaller than that of the track 3), preferably twisted and arranged in an anti-inductive mode. The thermal superconductive switch 13 can also be substituted by a superconductive track having a suitable section smaller than that of the track 3. The track 3 is also connected in points 9 and 9' with two external current sources at points 11 and 11' equipped with two switches 10 and 10'.

When the thermal superconductive switch 13 is hot, i.e. its temperature is higher than the critical temperature of the superconductive material of which it is composed, it offers a high current resistance and the track 3 practically behaves like an open track. Under these conditions, the track 3 can be fed in the current from the outside by closing the switches 10 and 10' of the current sources at points 11 and 11'.

When the thermal superconductive switch 13 is cold, i.e. its temperature is below the critical temperature, the track 3 and thermal superconductive switch 13 connected to it, behave like a closed track, allowing the electric current to circulate on the whole track-thermal superconductive switch circuit without discontinuity. In this configuration, i.e. when current is circulating, the feeding of the electric current through the external current sources at points 11 and 11' can be suspended by opening the switches 10 and 10'.

The versatility of the connections that can be obtained with the superconductive elements of the present invention, offers considerable advantages. In particular, through the connection, in series or parallel, of two or more superconductive elements, possibly also having two or more superconductive tracks on a same support and connected to each other, it is possible to produce superconductive devices having the topologies and lengths most adequate for the specific applications for which they are destined.

Figure 5:
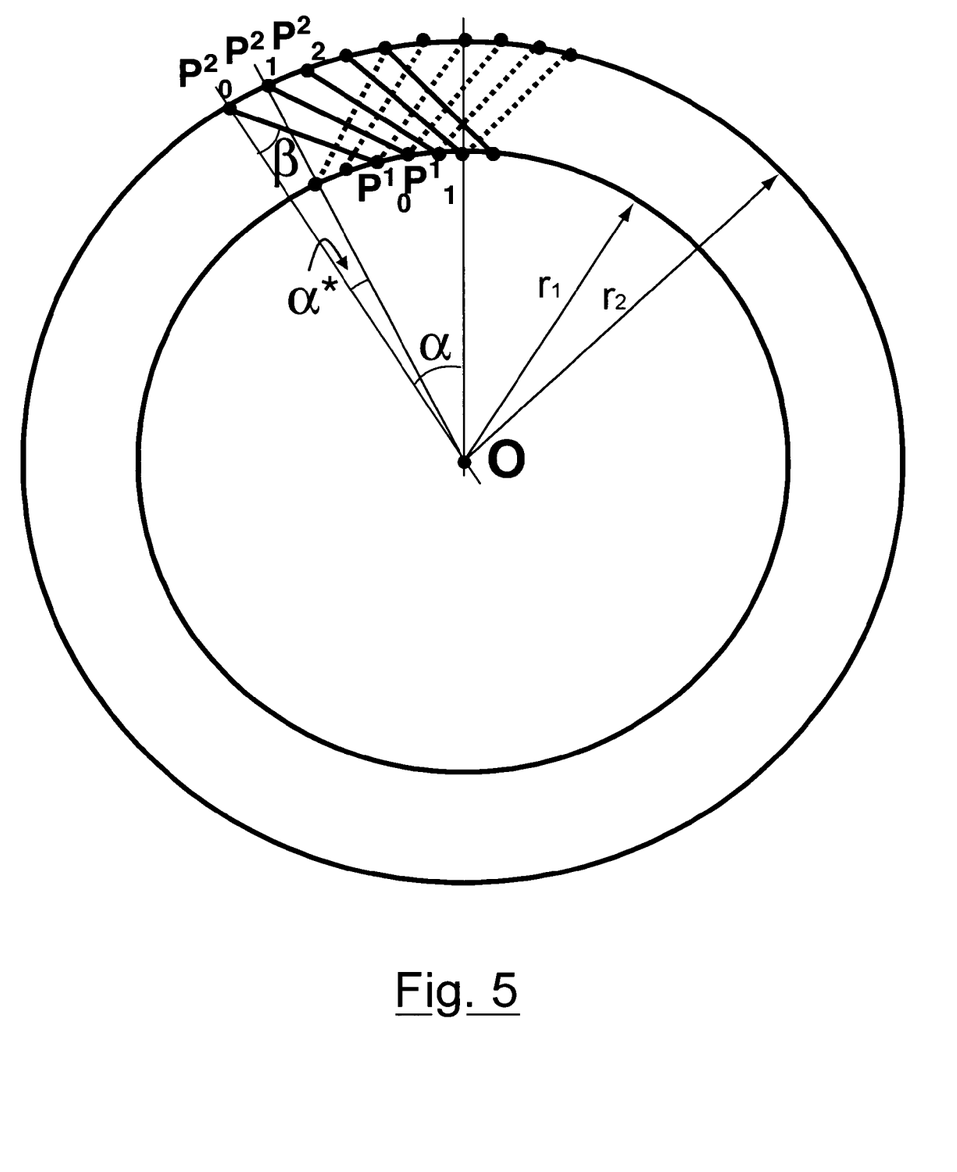
FIG. 5, schematic representation of a superconductive element having inlays of the helicoidal type.

In a preferred embodiment of the present invention, the superconductive elements consist of supports having helicoidal inlayed tracks. An example of a superconductive element with inlayed tracks of the helicoidal type, which are closed after a certain number of spirals, is illustrated in FIG. 5. The superconductive element of FIG. 5 comprises a support having a rectangular section in the form of a ring. Tracks in the form of straight lines (oblique tracks) tilted with respect to the median axis of the pass-through ring for the centre O, are inlayed on the larger surfaces of the rectangle. The inclination of the oblique tracks belonging to one of the two larger surfaces of the support, is equal to a deviation angle $\beta$; the tracks which belong to the opposite surface, have a deviation angle equal to 180-$\beta$. The tilted tracks connect two series of points $P^1_i$ and $P^2_i$, respectively positioned along the internal circumference of the support with a radius $r_1$ and along the outer circumference with a radius $r_2$. To obtain the necessary helicoidal continuity of the tracks, the points $P^1_i$, in addition to being connected with the corresponding points $P^2_i$ on the same surface of the support, are also connected through superconductive pass-throughs with the corresponding superconductive tracks inlayed on the opposite surface of the support.

To ensure that the helicoidal development of the tracks leads to a uniform coverage of the whole support in the form of a ring and is closed, i.e. the starting point and arrival point of the helicoidal development coincide, the angle $\alpha$ of FIG. 5, which subtends a single spire composed of two tracks which leave from a same point ($P^1_0$ in FIG. 5) on the two opposite sides of the support and the corresponding connection pass-throughs, and the angle $\beta$ defined above, which defines the orientation of the tracks with respect to the median axis of the ring, must satisfy the following relation:

$$\beta = \arctg\left(\frac{r_1 sen(\alpha/2)}{r_2 - r_1 \cos(\alpha/2)}\right).$$

The position of the points $P^1_i$ and $P^2_i$ on the surface of the support can be indicated in the following way. The number of spires of which a single spiral which envelops the whole ring is defined with n and m indicates the integer number of spirals, each shifted by an angle $\alpha^*$ from the previous spiral, necessary for re-joining the starting point of the first spiral. The angle $\alpha^*$ is in the following relation with n and m: $\alpha^*=360/[n^*m]$.

Therefore, the polar coordinates $P(r,\theta)$ of each point $P^1_i$ and $P^2_i$, connected by the tracks, are thus defined:

$$P^1_i=(r_1,\alpha^*(\frac{1}{2}+i/m)),$$

$$P^2_i=(r_2, i\,\alpha/m),$$

with i=0, 1, 2, . . . , n*m.

The distance between the pairs of points connected by a track in the form of a tilted straight line is equal to $$\frac{r_2 - r_1 \cos\alpha/2}{\cos\beta}.$$

Figure 7A:
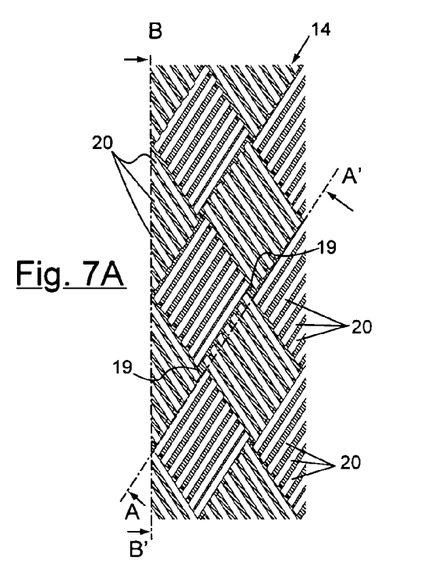
FIG. 7A, plan view from above of a schematic representation of a superconductive element in the form of a strip consisting of parallel interwoven inlays.
Figure 7B:
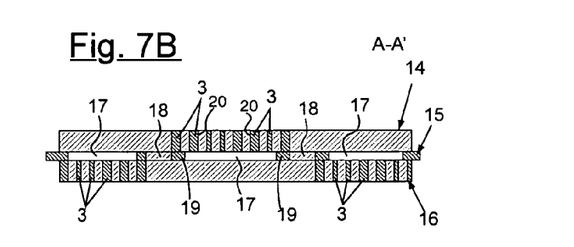
FIG. 7B, section according to the plane A-A' of FIG. 7A.
Figure 7C:
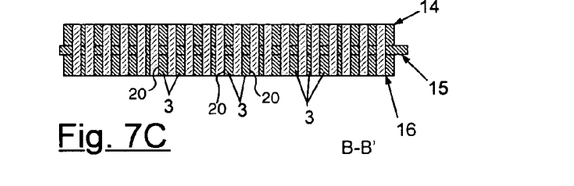
FIG. 7C, section according to the plane B-B' of FIG. 7A.

In another embodiment of the present invention, the superconductive element is produced in the form of a strip having the desired length. With reference to FIGS. 7A-7C, the superconductive element in the form of a strip 13 comprises at least three superimposed layers. The most external layers 14 and 16 consist of supports inlayed with parallel superconductive tracks 3 situated inside grooves 20 (in FIG. 7A only the empty grooves 20 present on the support 14 are shown). The supports 14 and 16 are positioned in contact with the two opposite sides of a central metallic support 15, and are oriented so that the superconductive tracks 3 of the first layer 14 develop along a distinct direction with respect to those of the second layer 16. The superimposition of the three layers 14, 15 and 16 produces a superconductive element having interwoven superconductive tracks. The central metallic support 15 has cavities 17 for housing the reactant material, connection holes 18 (pass-through holes) suitably arranged for connecting the superconductive tracks of the layer 14 with those of the layer 16 and riveting points 19 of the three layers.

As already mentioned, a further object of the present invention relates to a process for preparing a superconductive element of the type described above, said process comprising the following operative steps:

a) making at least one groove on the surface of a rigid support made of non-superconductive material;

b) inserting a powdered precursor of a superconductive material inside the groove and compacting it up to a real density value equal to at least 50% of the theoretical density value;

c) positioning at least one solid reactant in contact with the precursor powder or else in a position adjacent to the groove in which the powder is contained;

d) subjecting the reactant and the groove containing the precursor to heating until the reactant is liquefied and subsequently infiltrates inside the precursor powder with the formation of a superconductive track inside the groove.

Step a) comprises the formation of at least one groove on the surface of the rigid support, said groove, after the insertion of the precursor and relative transformation to superconductive material, forming the track of superconductive material.

Step b) of the process comprises filling the groove with a precursor of the superconductive material and its compacting.

The precursor typically consists of a material solid at room temperature in powder form. It is placed in the groove and, before being subjected to the conversion reaction into a superconductive material, is compacted until it has a real density value equal to at least 50% of the value of its theoretical density. This compacting of the powder enables a superconductive material to be obtained from the conversion reaction of step d), which completely fills the groove and has a density higher than 85% of the theoretical value, preferably higher than 88%.

For the purposes of the present invention real density means the ratio between the powder mass and total volume, including the empty spaces between the powder grains, occupied by this in the groove in which it is inserted.

The compacting can be effected according to the conventional techniques and pressure instruments used in the field for powder compacting (for example uniaxial or isostatic cold pressing, rolling).

Examples of precursors of superconductive material are:

boron powder possibly with the addition of submicronic carbon powder, with submicronic SiC powder or with Mg—Zn or Mg—Co alloy powders;

mixture of Cu—Sr alloy powder and strontium peroxide powder;

mixture of powders of iron and an element belonging to the rare earth group (lanthanides), preferably neodymium;

mixture of powders of Fe and Te, possibly with the addition of sulphur;

mixture of powders of Fe and Se, possibly with the addition of sulphur.

A particularly preferred precursor is microcrystalline boron in powder form, mechanically activated, which, in the presence of liquid metallic magnesium, under suitable reaction conditions, can be converted into the superconductive material $MgB_2$.

Step c) of the process comprises positioning the at least one solid reactant (hereafter also called solid body), i.e. of a compound capable of reacting with the powder precursor to form a superconductive material. The solid body or bodies are positioned on the support above the grooves, in contact with the precursor powder or in a position adjacent to the grooves and such that, once it has been brought to the liquid state by heating under suitable temperature and pressure conditions, the liquid reactant can infiltrate into the groove and enter into contact with the precursor. The chemical reaction between the precursor powder contained in the groove and the liquid reactant forms a superconductive material and therefore a superconductive track inlayed in the support.

When a superconductive element having superconductive tracks in $Sr_2CuO_{3.4}$ is prepared, in step b) a precursor consisting of a powder mixture of Cu—Sr alloy and strontium peroxide powder is used and in step c) the solid body consists of strontium peroxide.

When a superconductive element in $FeNdAsO_{0.85}$ is prepared, in step b) of the process, a precursor consisting of a mixture of Fe and Nd powders is used. In step c) the solid reactant bodies used consist of composites of As and As oxide.

When a superconductive element having superconductive tracks in $FeTe_{0.5}Se_{0.5}$ is prepared, in step b) of the process a precursor consisting of a mixture of Fe and Te powders or a mixture of Fe and Se powders, is used. In step c), the solid reactant bodies used can consist of Se, Te or an Se—Te alloy.

The chemical reaction which takes place in step d) by infiltration of the liquid reactant or reactants into the compacted precursor powder, contained in the grooves of the support, is effected in a closed environment consisting of a sealed container. The reaction is generally carried out by heating the whole container comprising the support having the grooves filled with the precursor and other reactants, in the form of solid bodies, positioned outside the grooves, at a temperature ranging from 400° C. to 1100° C. and for a duration varying from 30 minutes to 30 hours.

In the case of $Sr_2CuO_{3.4}$ tracks, the heating is preferably effected at a temperature ranging from 400 to 1000° C. and for a duration of 1 hour to 20 hours. This treatment is followed by a further thermal treatment at temperatures ranging from room temperature to 300° C. and for a time of 1 to 10 hours, in a controlled atmosphere (oxidizing or reducing) in order to reach the desired stoichiometric oxygen content for the superconductive material.

In the case of $FeNdAsO_{0.85}$ tracks, the heating is preferably effected at a temperature ranging from 900 to 1200° C. and for a duration ranging from 30 minutes to 30 hours.

In the case of $FeTe_{0.5}Se_{0.5}$ tracks, the heating is preferably effected at a temperature ranging from 500 to 900° C. and for a duration ranging from 30 minutes to 10 hours.

The sealing of the container is generally effected after substituting the air in its interior with inert gas such as argon. In some cases, for example, when the superconductive material $Sr_2CuO_{3.4}$ or $FeNdAsO_{0.85}$ is to be prepared, the inertization of the atmosphere of the container before the sealing is not necessary.

To effect the conversion of the precursor into a material having superconductive properties (step d), reaction containers having an adequate form and dimensions for housing one or more rigid supports and possible superconductive filaments connecting different supports, are used.

The material of which the container is composed is selected in relation to the type of precursor used. The material of the container must be such as to not react with the precursor and with the other reactants under the operative conditions of step d). In order to obtain superconductive elements having tracks in $MgB_2$, the container can be produced with any material resistant up to temperatures of about 1000° C., for example steel, preferably stainless steel.

Again, in order to avoid undesired reactions during step d), the reaction container can be internally coated with a protective layer of a specific inert and refractory material. To produce superconductive elements having tracks in $Sr_2CuO_{3.4}$, the container must consist of materials resistant up to temperatures of about 1100° C., such as steel, titanium or alloys based on nickel and the protection of these materials can be obtained by surface oxidation in an oxidizing atmosphere. To produce superconductive elements having tracks in $FeNdAsO_{0.85}$, the container must consist of materials resistant up to temperatures of about 1200° C., for example titanium or stainless steel, and in this case it must be internally coated with a coating film consisting of $SiO_2$ or $Al_2O_3$. The coating film can be applied, for example, with the CVD technique.

Analogously, if a superconductive element having superconductive tracks consisting of the material $FeTe_{0.5}Se_{0.5}$ is to be obtained, steel coated with a thin coating film of $SiO_2$ or a thin intermetallic film of the ZnTe type can be used as material of the container, for example by vacuum deposition of the elements forming the film.

As already mentioned, in a particularly preferred embodiment of the present invention, the superconductive elements comprise superconductive tracks comprising highly densified $MgB_2$.

In the case of superconductive elements with superconductive tracks comprising highly densified $MgB_2$, the rigid support is produced with a material selected from the group of materials comprising: non-magnetic steel, in particular steels of the type AISI 304 and AISI 316, iron/nickel alloy, titanium, alloys based on nickel and copper, such as for example monel. The support is preferably made of non-magnetic steel, titanium or monel.

If an electric insulating protective coating film is needed inside and between the grooves, it could be vacuum deposited as oxides compounds such as MgO, Fe oxide, Ni oxide, Ti oxide. For example, this could be the case in which a copper support is used.

In order to produce a conductive track comprising $MgB_2$, step b) of the process comprises filling the groove or grooves produced on the support in step a) with a precursor consisting of crystalline or amorphous boron in powder form, mechanically activated, and possibly with the addition of submicronic SiC powder or submicronic carbon powder or Mg—Zn alloy or Mg—Co alloy powder. The mechanical activation of the amorphous boron is obtained for example by grinding in a mill with rotating cylinders. This activation operation allows the dimension of the intergranular aggregates to be reduced, with a better dispersion of the additive powders and an increase in the real density, i.e. the packing density, of the compacted powder at the moment of the filling of the grooves.

The crystalline boron, mechanically activated, can be obtained by repeated grinding of crystalline boron flakes having dimensions of various millimeters, preferably with a purity equal to or higher than 99.4%.

The grinding can be effected by compression, applying a high load, under "almost static" conditions, for example in an oleodynamic press, or under "dynamic" conditions by grinding between rotating cylinders. This activation, in addition to obtaining a powder with a finer particle-size (smaller than 100 micrometers, preferably smaller than 40 microns), also allows the exposed surfaces of the boron crystalline grains to be less contaminated by impurities, such as oxygen and humidity, thus making the powders more permeable to the liquid magnesium, from whose reaction with boron, $MgB_2$ is obtained.

In particular, the activated crystalline boron powder is selected so as to comprise particles having an average volumetric diameter ranging from 10 to 70 microns.

In step b) of the process, the mechanically activated boron powder is compacted inside the groove until a real density is obtained 50% higher than the theoretical density of the crystalline boron (theoretical density of the rhombohedral crystalline boron: 2.35 g/cm$^3$).

The boron in powder form which fills the groove can also contain, in a mixture, metal magnesium in a quantity of up to 20% atomic of magnesium. Also in this case the precursor situated inside the groove on the support must meet the real density requirement defined above.

As an alternative to the above-mentioned boron and magnesium mixture, the precursor can consist of a mixture obtained by the mechanical mixing of boron powder, mechanically activated, and $MgB_2$ powder having a particle-size lower than 30 microns, preferably lower than 10 microns. The quantity in moles of $MgB_2$ powder is lower than of equal to the moles of boron powder, preferably lower than 50% molar of the boron powder, more preferably lower than 30% molar of the boron powder. The real density of the mixture of boron powder and $MgB_2$, compacted inside the grooves on the support, must be higher than 1.2 g/cm$^3$, preferably higher than 1.4 g/cm$^3$.

In order to obtain a superconductive track comprising $MgB_2$, in step c) of the process one or more bodies of crystalline metallic magnesium having a purity over 99% are used. The position of the magnesium body or bodies must be such that, following the subsequent liquefaction of the magnesium under the operative conditions of step d), the liquid magnesium infiltrates through the activated boron powder or through the other mixtures containing boron powder described above, reacting with it and forming a conductive track in the groove comprising $MgB_2$ as superconductive material.

The magnesium body or bodies situated close to the grooves filled with boron have an overall mass which is such as to have an atomic ratio $Mg/B_{powder}$ higher than 0.5.

In a preferred embodiment, the magnesium body is in the form of a lamina having a thickness of 1-5 mm, which is superimposed with respect to the support after the grooves have been filled with the precursor (FIG. 2, lamina 6).

Alternatively, it is also possible to use with the high-purity magnesium bodies, bodies of an alloy of magnesium and one or more metals which have lower melting points than magnesium, such as for example, Ga, Sn, In and Zn, said low-melting metals being present in any quantity lower than the weight percentage corresponding to the composition of the eutectic point of the alloy corresponding to the majority of magnesium.

The tracks based on $MgB_2$ obtained using the above magnesium alloys have analogous superconductive properties than those obtained using high-purity metal magnesium.

The use of these alloys, having melting points lower than that of pure magnesium, allows the conversion reaction of the precursor made of superconductive material (step d) to take place in more rapid times and/or at lower temperatures, and has therefore proved to be a useful technique for reducing the cost of the preparation process of the superconductive elements object of the present invention, and for reducing the thermal dilation/contraction effects of the rigid support.

The rigid support having the grooves filled with precursor of the superconductive material together with the magnesium body or bodies is then transferred to a specific container of the type previously described. The container is sealed so as to contain in its interior an atmosphere of inert gas or an atmosphere having an oxygen content lower than 20% atomic. The pressure of the atmosphere inside the container is such as to ensure the presence of magnesium in liquid phase during the whole treatment of the subsequent step d). The sealing of the container is effected with the techniques and means known in the state of the art. For example, in the case of metallic containers, the sealing can be obtained by the welding of a closing lid (FIG. 2, lid 5).

For the preparation of a superconductive element having tracks comprising $MgB_2$, step d) for the conversion of the precursor to superconductive material comprises thermal treatment of the sealed support inside the container at a temperature of at least 700° C.

The thermal treatment is carried out for a time of at least 30 minutes. Step d) is preferably effected at a temperature ranging from 750 to 900° C. for 1-5 hours.

Due to the temperature and pressure exerted by the gaseous atmosphere present in the container, the solid magnesium (in the form of a massive body or lamina) is liquefied and infiltrates through the powder of the precursor present in the groove. The reaction between liquid magnesium and activated crystalline boron (possibly mixed with magnesium powder or $MgB_2$ powder), leads to the formation of an inlay of superconductive $MgB_2$ inside the track formed on the support.

The thermal treatment of the support for obtaining the superconductive element object of the present invention is effected by subjecting the whole container to heating, for example in an oven.

At the end of the treatment of phase d) the container is cooled and opened to recover the superconductive element having tracks in $MgB_2$.

The superconductive element is then cleaned of the residual materials of the reaction, especially the residues of re-solidified liquid magnesium (or of the other re-solidified liquid reactants, in the case of tracks in superconductive materials different from $MgB_2$) on the support, and brought to size by turning, milling, cutting and grinding operations.

The process, object of the present invention, can also be used, with slight modifications, for the preparation of superconductive elements having one or more superconductive tracks connected to one or more superconductive filaments so that, below the critical temperature of the superconductor, the electric resistance of the connection area is lower than $10^{-8}$ Ohm, preferably lower than $10^{-9}$ Ohm, and the connection area is capable of transporting at least $10^3$ A. The superconductive filaments which can be used in the connections are preferably $MgB_2$ filaments in the form of hollow fibres as resulting from the reactive infiltration process. An example of fibres which can be used for the purpose is that described in patent application MI2002A001004.

To obtain the connection between a superconductive track and a superconductive filament, it is possible to operate in two distinct ways. In the first mode, an end of said superconductive filament is cleaned of the non-superconductive material which is coating it and is inserted inside a groove and the groove is filled with the precursor of the superconductive material. In the second mode, an end of a precursor thread of the superconductive filament, i.e. a thread consisting of the same material as the powder precursor, is cleaned of the outer metallic sheath until the precursor powder is revealed and is inserted inside a groove and the groove is filled with the precursor powder of the superconductive material. The support with the superconductive filament or with the precursor filament inserted in the groove filled with the precursor is subsequently sealed inside a reaction container in an atmosphere of an inert gas or an atmosphere having an oxygen content lower than 20% atomic. The reaction container, in the first preparation method, can be equipped with one or more additional sealable openings, through which the part of superconductive filament protruding outside the support can be passed. In this way, only the part of filament inserted inside the track is subjected to the treatment of step d) of the process.

The process described allows superconductive elements to be prepared, having tracks based on $MgB_2$ and other high-density superconductors capable of guaranteeing the conveyance of high superconductive current densities.

The superconductive elements, object of the present invention, have higher electromagnetic, mechanical and thermal performances than analogous massive superconductors of the same material, form and overall volume of the end-product ready for use. As the superconductive material is produced in a highly densified form, but with a reduced thickness, the superconductive elements of the present invention do not have the dispersion problems of superconductive currents on the surface, typical of superconductors in the form of massive bodies. Furthermore, the reduced thickness favours the cooling of the superconductive material during its use. The preparation of superconductive elements comprising tracks based on $MgB_2$ also offers the additional advantage of being simpler to effect with respect to other forms of superconductive materials.

A further advantage of the superconductive elements of the present invention is revealed in applications of superconductive elements with closed tracks, particularly suitable for obtaining a stationary magnetic field, for example in substitution of classical permanent magnets. In this case, unlike superconductive massive bodies, they can be charged without the necessity of subjecting the superconductive element to a high excitation magnetic field. The element is charged much more simply by means of a current generator which feeds the necessary current by means of a system of thermal superconductive switches connected to the tracks of the element as previously described.

The use of the superconductive elements, object of the present invention, having superconductive tracks with a practically zero electric resistance, also offers the advantage of allowing the production of electromagnetic devices with a reduced energy consumption.

The superconductive elements, object of the present invention, have numerous industrial applications in a wide variety of technical fields.

The present invention also relates to the use of the superconductive elements according to the present invention as:
  current leads for superconductive systems or high-density current transportation rods between electrical networks,
  magnets for high-efficiency electrical motors or generators,
  current limiters,
  magnets for accumulating electrical energy,
  transformer coils
  magnets in devices for purifying waste water or for purifying coal dust from sulphurous substances,
  variable field magnets for diamagnetic cryogenic cooling,
  high-efficiency magnetic induction heaters,
  extremely low-friction levitated magnetic bearings, for revolving systems,
  high-field magnets for the magnetic separation of materials or for the orientation of anisotropic diamagnetic substances,
  superconductive linear motors for levitation vehicles,
  magnets for making static magnetic fields in magnetic resonance apparatuses,
  magnets for particle accelerators,
  magnets of large dimensions for studies on nuclear fusion,
  antennae for transmitting and receiving electromagnetic waves in the microwave field.

In particular, in the electro-technical field, the superconductive elements, object of the present invention, can be used for producing high-efficiency electric motors or generators, by positioning superconductive elements with open tracks in the stator and superconductive elements with closed tracks in the rotor. The high magnetic field that can be obtained with the superconductive elements, object of the present invention, allows more compact and lighter motors to be produced, with the same power, with respect to those currently known in the state of the art, and also capable of accelerating with greater rapidity.

With the superconductive elements, object of the present invention, it is also possible to prepare particularly effective current limiters, for example, in the control of fault currents of electric networks.

In an environmental field, purification processes of wastewater and the purification of coal dust of sulphurous substances can advantageously use the superconductive elements, object of the present invention, to produce large-dimensioned persistent magnets, with a magnetic induction of a few tesla.

The following embodiment examples are provided for purely illustrative purposes of the present invention and should not be considered as limiting the protection scope defined by the enclosed claims.

EXAMPLE 1

Figure 6:
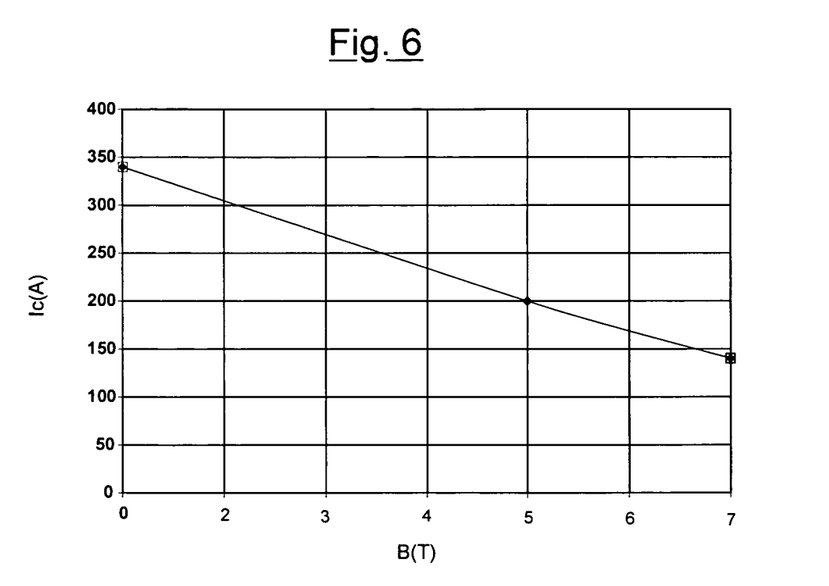
FIG. 6, graph of the critical current Ic trend (expressed in amperes) in relation to the magnetic flux density B (expressed in tesla), measured at 4.2K on the superconductive element of example 1.

A superconductive element according to the present invention was prepared as follows. A groove having a width of 0.5 to 1 mm and a depth of 4.5 mm, was formed, by electro-erosion, on the surface of a steel support in the form of a disk having a diameter of 60 mm. The groove was formed so as to create an open track on the support in the form of a spiral which unwinds into 7 spires starting from the internal diameter of 20 mm until it reaches the external diameter of 54 mm. The groove was filled with the precursor powder consisting of crystalline boron. The boron powder was mechanically activated by crushing in mill with rotating cylinders. The powder thus ground was then sieved with a sieve having meshes of 40 micrometers. The powder had an average diameter of 25 microns. The powder was compacted manually inside the groove by means of a roll until a real density equal to 1.2 g/cm$^3$ was reached. The support having the groove filled with the compacted powder was superimposed by a metallic magnesium lamina having a purity of 99.9% and a thickness of 7 mm. The support thus obtained was transferred to a steel container, whose interior was coated with a layer of Nb sheet having a thickness of 100 micrometers (total thickness 200 microns). Two Nb laminas each having a thickness of 100 microns were positioned on the bottom and under the lid of the steel container. The transferal of the support into the container was effected in air and a flow of argon was subsequently passed into the container, which was then sealed with the same atmosphere in its interior. The container was heated in an oven to a temperature of 900° C. for 3 hours. Once cooled, a superconductive element having an was extracted from the container, whose superconductive behaviour was verified at 4.2 K by measuring the critical current Ic in relation to the magnetic flux density B applied, as shown in FIG. 6.

EXAMPLE 2

A superconductive permanent magnet was prepared using, as superconductive element, a steel support in the form of a disk having a diameter of 70 mm and a thickness of 8 mm, on which two spiral grooves (dimensions: 1.5 mm in width, from 2.5 to 3.0 mm in depth) were inlayed, on both sides of its surface, which develop from the centre of the disk to the periphery in 16 spires according to an equi-directional trend, i.e. the two spirals are wound around the normal axis of the support in the same direction. The two grooves were joined through two holes having a diameter of 3 mm situated in the support so as to connect the two centres with each other and the two ends of the spiral grooves.

The same crystalline boron powder as Example 1 was inserted in the grooves and holes of the support, and compacted manually until a real density equal to 1.2 g/cm$^3$ was reached. Two magnesium laminas of the same type used in Example 1 were positioned on the support facing each other on both sides of the disk. The support thus prepared was then inserted in a steel container and thermally treated following the same procedure as described in Example 1, in an argon atmosphere, at a temperature of 900° C. for 3 hours. A superconductive element of MgB$_2$ with a closed spiral track was then extracted from the container. In particular, the two grooves joined in series by the pass-through superconductors form a closed track which is such as to create an equi-rotational trend of the electric current therein and, consequently equi-directional magnetic fields.

By positioning the superconductive element inside a superconductive magnet, a current was induced in the superconductive element which was maintained persistent even after the excitation magnet had been switched off. The current induced in the superconductive track was such that at a temperature of 12K, it was possible to measure, at 1 mm from the surface of the superconductive element, in correspondence with the centre of one of the two spirals, an entrapped persistent magnetic flux density of 1.15 tesla. As a comparison, a massive disk of MgB$_2$ having dimensions which were such as to contain a quantity of superconductive material three times greater than the present superconductive element, under analogous conditions of temperature and type of charging, maintained an entrapped magnetic flux density of 0.90 tesla.

EXAMPLE 3

A superconductive element consisting of a non-magnetic AISI 316 steel support in the form of a disk having a thickness of 8 mm and a diameter of 60 mm, having 19 superconductive closed tracks of MgB$_2$, inlayed on both surfaces, in the form of a concentric circle having a thickness of 0.5 mm, a diameter ranging from 52 mm to 10 mm and a depth of 3 to 4 mm, and a central cylinder having a diameter of 5 mm. The superconductive element was prepared as in Example 2 and its entrapped magnetic field flux density was measured, at its centre at a distance of 1 mm from the surface. A persistent magnetic flux density of 1 tesla was revealed at a temperature of 21K.

The invention claimed is:

1. Process for preparing a superconductive element comprising a rigid support made from non-superconductive material, said support comprising at least one superconductive track formed from a groove containing a superconductive material having a real density equal to at least 85% of the value of its theoretical density, comprising the following operative steps:
   a) making at least one groove on the surface of a rigid support made from non-superconductive material;
   b) inserting a material which consists of a powdered precursor of a superconductive material inside the groove and compacting said powdered precursor up to a real density value equal to at least 50% of the theoretical density value;
   c) positioning at least one solid reactant above the groove in contact with said powdered precursor of a superconductive material or in a position adjacent to the groove in which the powdered precursor of a superconductive material is contained, said solid reactant being a compound that, once it has been brought to the liquid state, is capable of reacting with said powdered precursor of a superconductive material to form a superconductive material; and
   d) subjecting the reactant and the groove containing the precursor to heating until the reactant is liquefied and subsequently infiltrates inside the precursor powder of a superconductive material with formation of a superconductive track inside the groove.

2. Process according to claim 1, wherein step b) comprises filling the groove or grooves made on the support in step a) with a precursor of a superconductive material selected from the group comprising:
   boron powder optionally added to with submicronic carbon powder, with submicronic SiC powder or with Mg—Zn or Mg—Co alloy powders;
   mixture of Cu—Sr alloy powder and strontium peroxide powder;

mixture of powders of iron and of an element belonging to the rare earths group (lanthanides), preferably neodymium;

mixture of powders of Fe and Te, optionally with added sulphur;

mixture of powders of Fe and Se, optionally with added sulphur.

3. Process according to the claim 1, wherein step b) comprises filling the groove or grooves made on the support in step a) with a precursor consisting of mechanically-activated crystalline or amorphous boron powder.

4. Process according to claim 3, wherein in step c) the reactant is crystalline metallic magnesium with a purity of above 99% in lamina form.

5. Process according to claim 4, wherein step d) comprises a heat treatment of the precursor inserted in the support and of the reactants sealed inside the container at a temperature of at least 700° C. for a time of at least 30 minutes, to a temperature of between 750° C. and 900° C. for 1-5 hours.

6. Process according to claim 1, wherein in step c) the reactant is a solid body of strontium peroxide, if the precursor is a mixture of Cu—Sr alloy powder and strontium peroxide powder, to obtain superconductive tracks of $Sr_2CuO_{3.4}$;

tellurium, selenium or a tellurium-selenium alloy, if the precursor is a mixture of powders of Fe and Te or else a mixture of powders of Fe and Se, to obtain superconductive tracks of $FeTe_{0.5}Se_{0.5}$;

compounds of As and As oxide, if the precursor is a mixture of powders of iron and neodymium, to obtain superconductive tracks of $FeNdAsO_{0.85}$.

7. Process according to claim 1, wherein step d) comprises a heat treatment of the precursor inserted in the support and of the reactants sealed inside the container at a temperature of between 400° C. and 1100° C. and for a variable time of between 30 minutes and 30 hours.

8. Process according to claim 6, wherein step d) comprises a heat treatment of the precursor inserted in the support and of the reactants sealed inside the container to obtain superconductive tracks of $FeNdAsO_{0.85}$, at a temperature of between 900° C. and 1200° C. and for a variable time of between 30 minutes and 30 hours;

to obtain superconductive tracks of $FeTe_{0.5}Se_{0.5}$, at a temperature of between 500° C. and 900° C. and for a variable time of between 30 minutes and 10 hours;

to obtain tracks of $Sr_2CuO_{3.4}$, at a temperature of between 400° C. and 1000° C. and for a time of between 1 hour and 20 hours, followed by a second heat treatment at temperatures of between room temperature and 300° C. for a time of between 1 and 10 hours, in oxidising or reducing atmosphere.

* * * * *